(12) United States Patent
Korenivski

(10) Patent No.: US 7,751,220 B2
(45) Date of Patent: Jul. 6, 2010

(54) METHOD AND ARRANGEMENT FOR ASSOCIATIVE MEMORY DEVICE BASED ON FERROFLUID

(76) Inventor: Vladislav Korenivski, Västergården 125, Vallentuna, 186 37 (SE)

( * ) Notice: Subject to any disclaimer, the term of this patent is extended or adjusted under 35 U.S.C. 154(b) by 83 days.

(21) Appl. No.: 12/091,829

(22) PCT Filed: Oct. 27, 2006

(86) PCT No.: PCT/SE2006/050435

§ 371 (c)(1),
(2), (4) Date: Apr. 28, 2008

(87) PCT Pub. No.: WO2007/050035

PCT Pub. Date: May 3, 2007

(65) Prior Publication Data

US 2008/0285323 A1    Nov. 20, 2008

(30) Foreign Application Priority Data

Oct. 28, 2005  (SE) .................................... 0502408

(51) Int. Cl.
*G11C 15/02* (2006.01)
(52) U.S. Cl. ...................................... 365/50; 365/49.17

(58) Field of Classification Search ................... 365/50, 365/151, 185, 171, 173, 153, 49.17
See application file for complete search history.

(56) References Cited

U.S. PATENT DOCUMENTS 3,508,215 A    4/1970   Cohler et al.

(Continued)

FOREIGN PATENT DOCUMENTS

| DE | 10 2004 010464 A1 | 9/2005 |
| WO | WO 2004/042705 A1 | 5/2004 |
| WO | WO 2004042705 A1 * | 5/2004 |

OTHER PUBLICATIONS

Goodwin et al., "Image Recognition and Reconstruction Using Associative Magnetic Processing," 1992, Journal of Pattern Recognition and Artificial Intelligence, 6(1), pp. 157-177.*

(Continued)

*Primary Examiner*—Tuan T Nguyen
*Assistant Examiner*—R Lance Reidlinger
(74) *Attorney, Agent, or Firm*—Foley & Lardner LLP

(57) ABSTRACT

An associative memory device includes a magnetically responsive layer adapted to store a representation of a pattern, the magnetically responsive layer includes magnetic nanoparticles as a magnetically active component. The magnetic nanoparticles of the associative memory device are dispersed in a solvent with variable viscosity, and the magnetically responsive layer is a layer of ferrofluid.

5 Claims, 4 Drawing Sheets

U.S. PATENT DOCUMENTS

| | | | | |
|---|---|---|---|---|
| 4,497,007 | A | * | 1/1985 | Greiner et al. ......... 360/114.01 |
| 7,170,842 | B2 | * | 1/2007 | Gibson ....................... 369/101 |
| 2007/0224517 | A1 | * | 9/2007 | Yellen et al. .................... 430/5 |

OTHER PUBLICATIONS

Ban et al., "Pattern storage and recognition using ferrofluids," Journal of Applied Physics, 2006, 99:08R907-1 to 08R907-3.

Dieny et al,. "Giant magnetoresistance in soft ferromagnetic multilayers," Physical Review B, Jan. 1, 1991, 43(1):1297-1300.

Goodwin et al., "Image recognition and reconstruction using associative magnetic processing," Journal of Pattern Recognition and Artificial Intelligence, 1992, 6(1):157-177.

Kalikmanov et al,. "Statistical thermodynamics of ferrofluids," Physica A, 1992, 183:25-50.

Korenivski et al., "Magnetic film inductors for radio frequency applications," Journal of Applied Physics, Nov. 15, 1997, 82(10:5247-5254.

Qi et al., "Monte Carlo Stimulation of Light Scattering from Magnetic Fluids as a Function of the Particle Chain Width," IEEE Transactions on Magnetics, Mar. 1996, 32(2):297-301.

Rosen, Bruce," Large Scale Simulations of a Spin Glass Image Associative Memory," 1993, *IEEE International Conference on Neural Networks*, IEEE Press, San Francisco, CA, 908-913.

Satoh et al., "Potential curves and orientational distrubitions of magnetic moments of chainlike clusters composed of secondary particles," Journal of Magnetism and Magnetic Materials, 1996, 154:183-192.

Satoh et al., "Two-Dimensional Monte Carlo Simulations to Capture Thick Chainlike Clusters of Ferromagnetic Particles in Colloidal Dispersions," Journal of Colloidal and Interface Science, 1996, 178:620-627.

* cited by examiner a)

b)

a)

b)

c)

METHOD AND ARRANGEMENT FOR ASSOCIATIVE MEMORY DEVICE BASED ON FERROFLUID

CROSS-REFERENCE TO RELATED APPLICATIONS

This application is the U.S. National Stage application of PCT/SE2006/050435, filed Oct. 27, 2006, which claims priority from Swedish application SE 0502408-8 filed Oct. 28, 2005.

FIELD OF THE INVENTION

The present invention relates to associative memories. In particular the invention relates to associative memories based on random magnetic materials.

BACKGROUND OF THE INVENTION

Associative memory is the important function performed by neural networks (NN), often used in image recognition [1]. Recent advances in creating artificial neural networks (ANN) have lead to numerous proposals for implementing such memory function. These largely focus on software based algorithmic methods and VLSI designs, but also on idealized physical systems such as Ising spin chains and spin glasses [2]. A detailed physical design of an associative memory based on a magnetically responsive layer, a thin layer of spin glass, where the hidden synaptic weights are represented by inter-spin exchange interactions, has been proposed [3, 4]. It is well known, however, that the spin glass behaviour is lost already by room temperature, so the oscillatory exchange interactions found at the core of the proposed memory principle are not present at the operating temperatures. Rather high operating temperatures needed for achieving a mechanical motion of the magnetic atoms in the spin glass film during training (typically of the order of the melting point of the metal, $\approx 1000K$) far exceed the typical spin glass transition temperatures (typically 1-100 K) above which there can be no input-output magnetic correlations.

SUMMARY OF THE INVENTION

Significant shortcomings of the prior art are evident from the above. Hence, it would be desirable to provide an associative memory device that is functional above cryogenic temperatures.

The object of the invention is to provide a device and a method that overcomes the drawbacks of the prior art. This is achieved by the device as defined in claim 1, and the method as defined in claim 5.

The associative memory device according to the invention provides a new implementation of an ANN, which is based on a ferromagnetic nano-colloid [5] and can be used for pattern storage and recognition. The proposed design is free from the limitations of the spin glass based ANN described above, since the particle-particle dipolar interactions in ferrofluids survive to temperatures well above room temperature. Furthermore, the carrier liquid in ferrofluid is the efficient built-in means providing the necessary mechanical mobility for forming and modifying particle patterns, and makes the system similar in nature to real 'soft' NN's such as the human brain.

Embodiments of the invention are defined in the dependent claims. Other objects, advantages and novel features of the invention will become apparent from the following detailed description of the invention when considered in conjunction with the accompanying drawings and claims.

BRIEF DESCRIPTION OF THE FIGURES

The features and advantages of the present invention outlined above are described more fully below in the detailed description in conjunction with the drawings where like reference numerals refer to like elements throughout, in which.

DETAILED DESCRIPTION OF THE INVENTION

Embodiments of the invention will now be described with reference to the figures.

Figure 1:
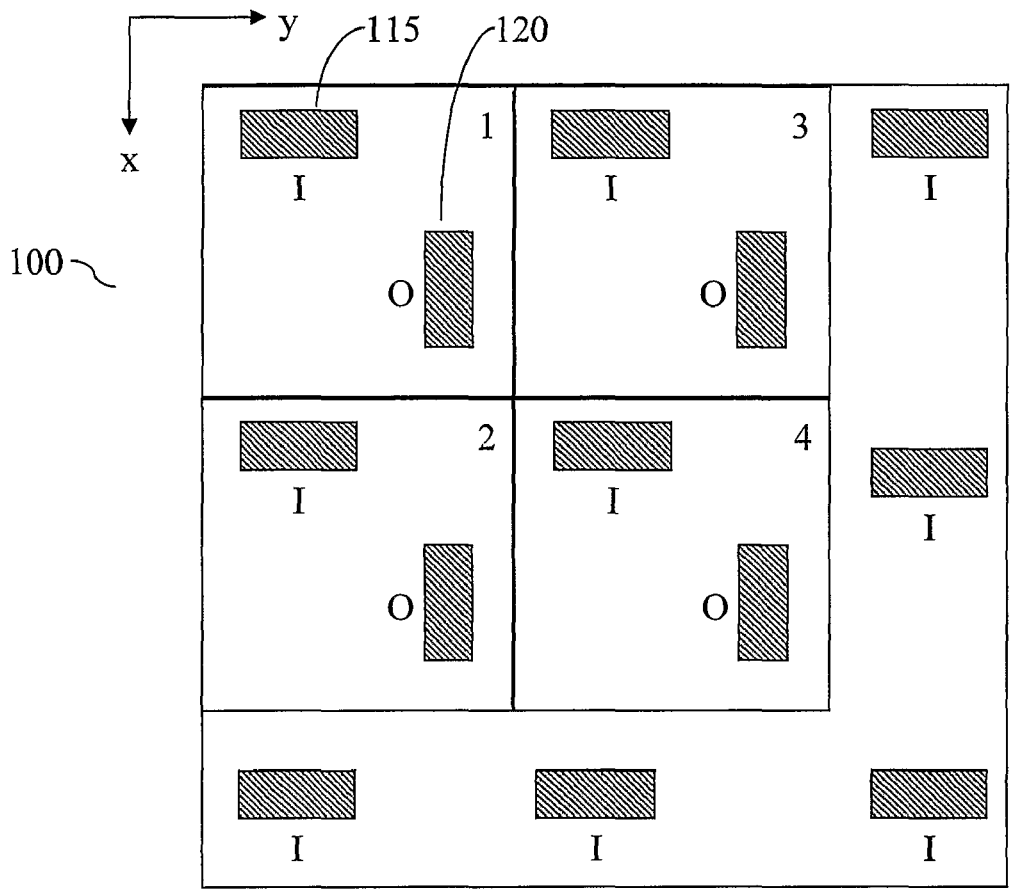
FIG. 1 is a schematic illustration of the associative memory device according to the invention a) top view and b) side view.
Figure 1:
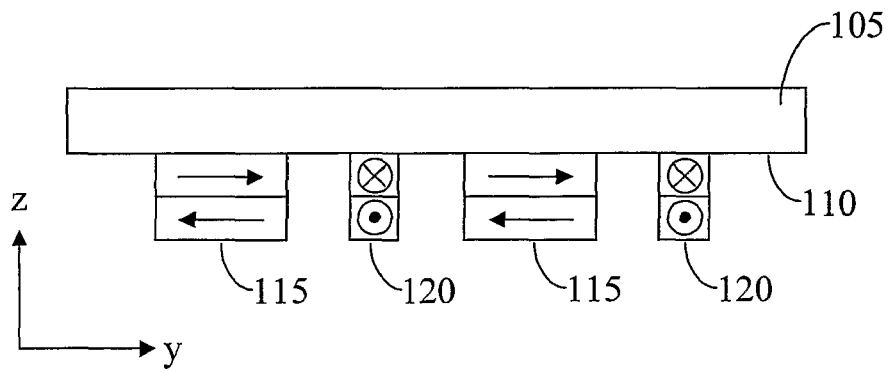

The associative memory device 100 according to the invention is schematically illustrated in FIG. 1. and comprises a ferrofluid layer 105, i.e. magnetic nanoparticles in a layer of solvent, providing the magnetically responsive layer. The solvent may be water, oil, paraffin, etc and have a viscosity of which preferably should be variable by small changes of temperature near room temperature. The magnetic nanoparticles, which are the magnetically active component in the ferrofluid, correspond to the "hidden units" in the NN analogy, and the dipolar interaction between the particles can be seen as the synaptic weight. The particles in the fluid are typically ferromagnetic and of small size (10 nm), such that the magnetization is single domain [6].

Figure 2:
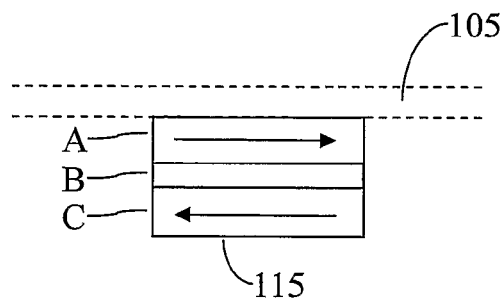
FIGS. 2a-c are schematic illustrations of input pads according to the present invention with magnetic layers (A, C) and a nonmagnetic spacer (B), a) cross sectional view, b) top view.
Figure 2:
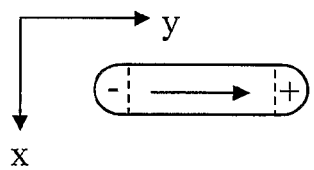
Figure 2:
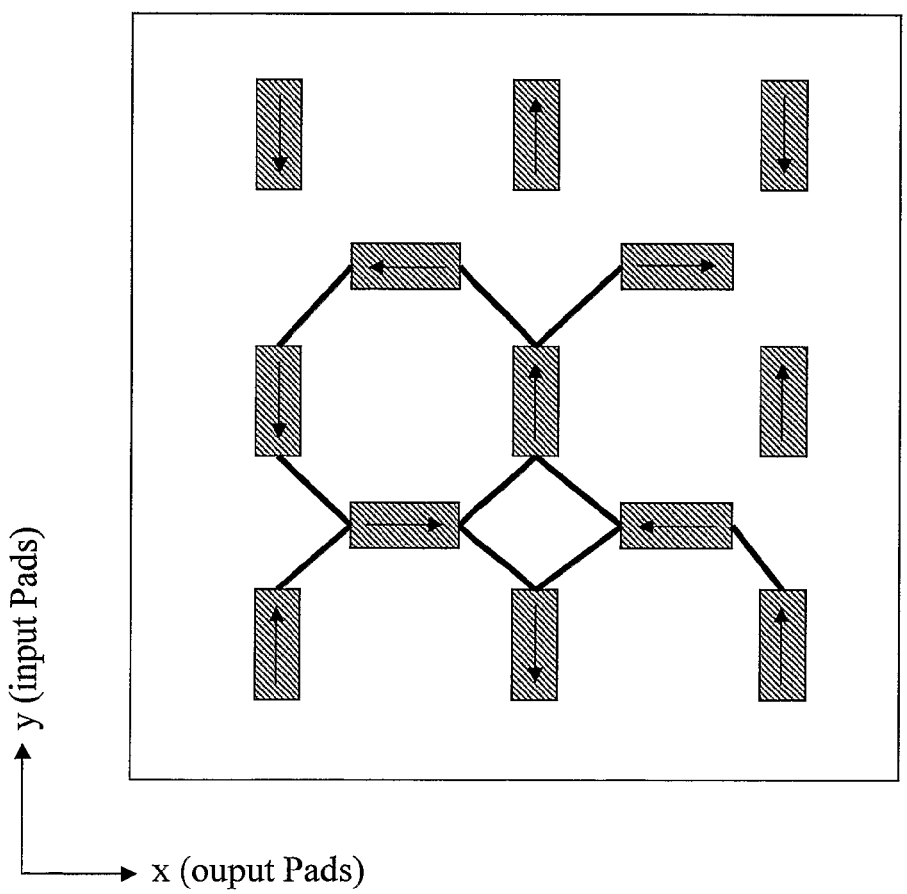

Below the ferrofluid layer 105 is a thin bottom plane 110. On the bottom plane are a plurality of multilayered inductive elements provided [12]. The inductive elements, or pads, are arranged pairwise with input inductive elements, hereafter referred to as input pads 115 and output inductive elements, hereafter referred to as output pads 120, and designed to produce desired local magnetic fields corresponding to the patterns being stored or recalled. The generic layout of a block of four cells is shown in FIG. 1. Each input pad (I) 115 has 4 nearest neighbour output pads (O) 120. All pads are placed under a thin bottom plane. The pads are preferably tri-layers with the top and bottom magnetic films separated by a metal spacer, in which a controlling current can switch the pad into the parallel (P) or antiparallel (AP) magnetic configuration, corresponding to strong and weak local fringing fields, respectively. The proposed layout of the input pad is shown in FIG. 2. The structure can be designed [12] to produce high local fringing fields in training (P-state) and low fields in recall (AP-state). The low fields during recall are achieved in the AP state of the asymmetric in thickness tri-layer, with most but not all of the flux closed within the pad. The output pads have a symmetric in thickness tri-layer (not shown), so that all flux is closed in the AP state of the O-pad during recall. The output pads are designed to additionally perform sensing of the local fields during recall using the spin-valve property of the magnetic sandwich [13, 14].

According to the invention the ferrofluid layer 105 is trained to store patterns by applying input-output field sets using the input/output pads 115/120. Each cell of the proposed device contains one input and one output pad, and a large number of magnetic dipoles ($\approx 10^3$), assumed to have a variable mobility. The mobility of the particles in the ferrofluid can be controlled by varying the temperature of the solvent in the vicinity of room temperature. During the application of the input/output pattern pair the magnetic nanoparticles in the colloid are allowed to move and their moments are allowed to rotate to minimize the total magnetic energy of the system. The above training sequence can be accomplished by switching the appropriate input/output pads 115/120 into their P states (P-left or P-right, corresponding to digital '0' or '1', see FIG. 2). The particles are allowed to move and their magnetic moments rotate until the system reaches equilibrium, at which point the particle locations are fixed by changing the viscosity of the solvent, for example by lowering the temperature.

Pattern recall is done by allowing the magnetic moments of the nanoparticles to rotate (but not move) in response to a given input. The input elements receive the same input pattern as the one that was used in training, but now the input pads 115 are switched into the antiparallel state in order to reduce the direct influence of the input fringing fields on the output pads 120. During recall, the output pads 120 are used in a field sensing rather than field setting mode. For this the output pads 120 are also set into the AP state. symmetric (see Design) with zero fringing fields. The field sensing property of the output pad magnetic tri-layer (known as the spin-valve [13]) serves to read out the effective dipolar fields produced by the local (immobilized) pattern of nano-dipoles.

The training sequence according to the method of the invention comprises the steps of:
a. imposing simultaneously an input and an output pattern, by exposing the ferrofluid layer with localised magnetic fields, wherein a first set of fields corresponds to the input pattern, and the second corresponds to the output pattern;
b. letting the magnetic nanoparticles of the ferrofluid equilibrate with respect to particle positions and spin directions;
c. fixing particle positions.

The recalling sequence according to the method of the invention comprises the steps of:
d. imposing the input pattern to the ferrofluid layer;
e. letting the spin orientations equilibrate;
f. sensing the magnetic field from the ferrofluid layer.

The present invention has been illustrated with a single pattern storage and recall.

The associative memory device and method according to the invention could easily be adapted for multiple pattern storage and recall. Given that the dipolar interactions decay relatively quickly with distance, the memory function is to a large limited to the nearest neighbour cells. Extending the proposed design to recalling multiple patterns will likely involve increasing the particle/pad dimensional ratio compared to the single pattern case.

The use of the associative memory device and the method according to the invention is further illustrated by the below described simulation:

Since the pads are much larger than the particles, they cannot be modelled magnetically as dipoles. Instead, the interaction of the nanoparticles with the pads is calculated by meshing the pads into small elements (effectively concentrated at the ends of the pads) and computing the fields at the particle locations from such elements to obtain the Zeeman pad-particle contribution to the total energy. The typical cell size is 500 nm corresponding to 30 particle diameters. The I/O patterns were up to 6×6 cells. The 'hidden units' in the proposed design (neurons in the NN case) are magnetic nanoparticles in a thin layer of a solvent (water, oil, paraffin, etc.), the viscosity of which should be variable by small changes of temperature near room temperature. What is know in NN's as synaptic weights, mediating the inter-neural interactions, are the inter-particle magnetic dipolar interactions. The particles in the fluid are taken to be ferromagnetic and of small size (10 nm), such that the magnetization is single domain [6]. Each particle is characterized by its magnetic moment, m(r), which can change its direction and position in the fluid film but not the magnitude. The particles are assumed to be coated with a 2 nm thick anti-agglomeration layer, which sets the shortest interparticle distance for the simulations ($\approx 4$ nm). The complete description of ferrofluids within the framework of statistical mechanics includes many contributions from the various interactions in the liquid. However, effects of the carrier liquid and the surfactant can often be neglected since they can only have an indirect influence on the magnetization. A model of a ferrofluid describing both magnetic particles and the carrier fluid is discussed by Kalikmanov [9], who shows that the carrier liquid has no influence on the equilibrium magnetic properties of the ferrofluid as a whole under some realistic assumptions.

The nano-colloid is therefore described as a system of dipoles, i=1, . . . , n. each carrying a magnetic moment $m_i$ and interacting with the local effective field from the pads $H_e$ via the Zeeman potential $V_i = -m_i H_e$. The pairwise dipole-dipole interactions are described by $$V_{ij}^{DD} = -\frac{3(m_i \cdot r_{ij}^\wedge)(m_j \cdot r_{ij}^\wedge) - m_i \cdot m_j}{4\pi\mu_0 r_{ij}^3}. \quad (1)$$

The hard-shell short range potential [5] of $\approx 2$ nm is used in the simulations below, so the closest distance between the surfaces of the nanoparticles is 4 nm. We perform a Monte Carlo simulation of the system using the cluster-moving algorithm [7, 10], which takes into account the cooperative behavior of the particles, and the particle mesh method [11] for faster convergence.

Training and Recall

The thin ferrofluid layer is trained to store patterns by applying input-output field sets using nano-sized magnetic pads placed under the surface of the colloid. Each cell of the proposed device contains one input and one output pad, and a large number of magnetic dipoles ($\approx 10^3$), assumed to have a variable mobility. The mobility of the particles in the ferrofluid can be controlled by varying the temperature of the solvent in the vicinity of room temperature. During the application of the input/output pattern pair the magnetic nanoparticles in the colloid are allowed to move and their moments are allowed to rotate to minimize the total magnetic energy of the system. The system is then cooled (i.e., the particles immobilized) in this minimum total energy configuration, which includes the Zeeman-like pad-particle and dipolar inter-particle contributions. The resulting (immobilized) network of nano-dipoles 'associates' the specific patterns imposed at the input and output by magnetically linking the I/O pads.

The above training sequence can be accomplished by switching the appropriate I/O elements into their P states (P-left or P-right, corresponding to digital '0' or '1', see FIG.

2). The particles are allowed to move and their magnetic moments rotate until the system reaches equilibrium, at which point the particle locations are stored.

Figure 3:
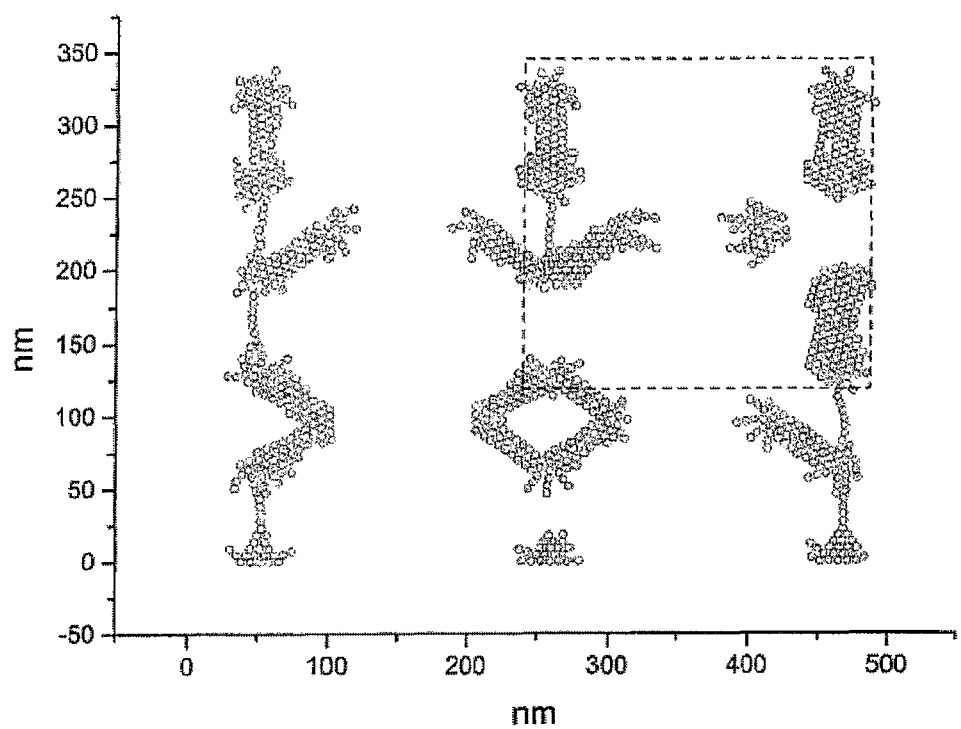
FIG. 3 is an illustration of the ferrofluid after a training sequence.
Figure 4:
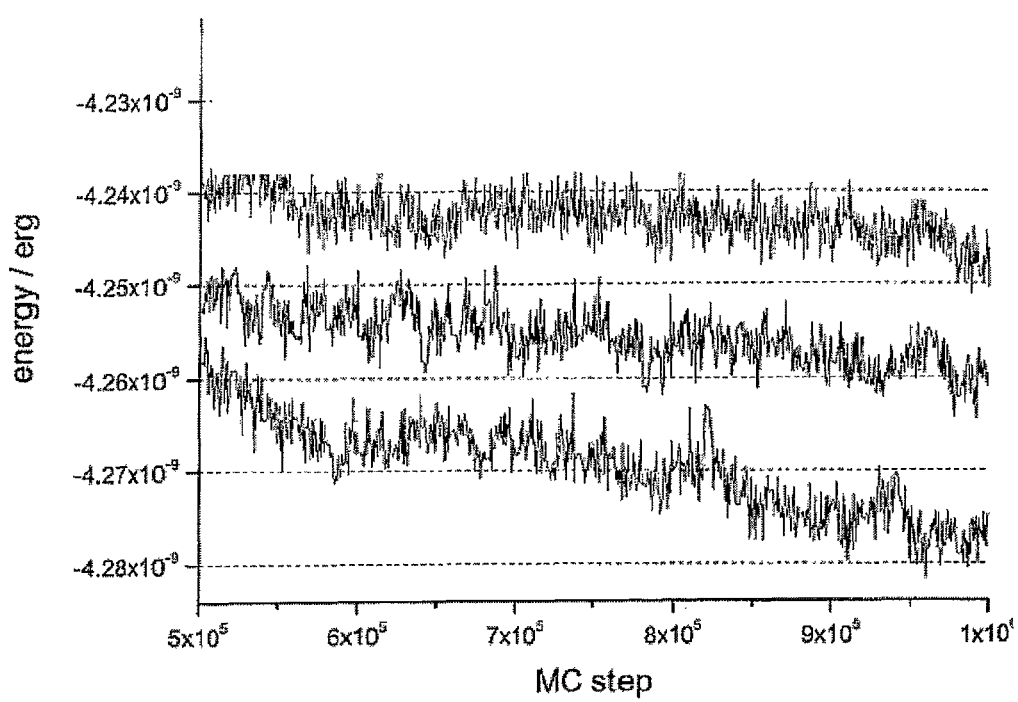
FIG. 4 comparison of standard, cluster moving (CM) and an enhanced CM algorithms.

The result of such training sequence for a 9-input (3×3) 4-output (2×2) system at 300 K is shown in FIG. 3. The particles are 15 nm in diameter with a 2.25 nm polymer shell and a magnetic moment of 1220 emu/cc. The magnetization of the I/O pad material is 1700 emu/cc (corresponding to that of Fe). The MC simulation is 2-D with the magnetic fraction of the ferrofluid of 15%. The size of each cell is 620×490 nm$^2$. The input and output pads are 80×210×40 nm$^3$ and 300×80×40 nm$^3$, respectively. The rhombic link at the bottom center, for example, corresponds to inward directed moments of the lateral I-pads and outward directed O-pads. all in the P-state (for layout see FIG. 1). In this example, the nanoparticle mediated I/O coupling is strongest for the 4 nearest neighbour pads. A typical training simulation ran for ≈10$^6$ Monte Carlo steps. A modified cluster-moving algorithm [10, 14] resulted in the fastest convergence to the equilibrium as illustrated by FIG. 4 for a 2×2 system. We find, however, that the exact details of the particle random walk algorithm are not critical for the conclusions reached in this work.

Figure 5:
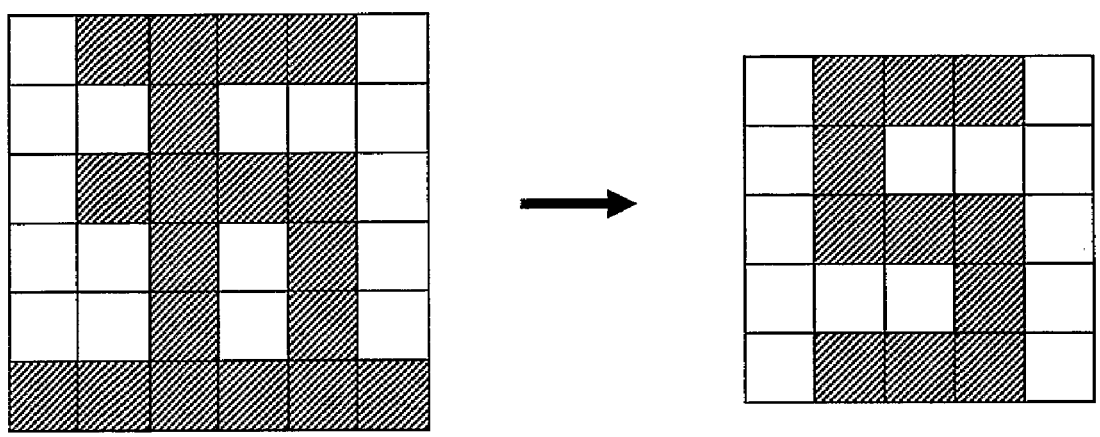
FIG. 5 illustrate a pattern recognition process using the present invention, associating a Chinese (left) and an Arabic (right) "5".

Pattern recall is done by allowing the magnetic moments of the nanoparticles to rotate (but not move) in response to a given input. The input elements receive the same input pattern as the one that was used in training, but now the input pads are switched into the antiparallel state in order to reduce the direct influence of the input fringing fields on the output pads. During recall, the output pads are used in a field sensing rather than field setting mode. For this the output pads are also set into the AP state. symmetric (see Design) with zero fringing fields. The field sensing property of the output pad magnetic tri-layer (known as the spin-valve [13]) serves to read out the effective dipolar fields produced by the local (immobilized) pattern of nano-dipoles. The sensed output pattern, with its magnitude and direction, is then compared to the one imposed during training. The recall is successful if the two coincide. A pattern recognition example is shown in FIG. 5 for a 6×6 input and 5× output system trained to associate the Chinese and Arabic characters for digit "5". 100% accuracy is reached for the output sensor threshold field of 25 Oe. Reaching the correct output in this example required a rather short sequence of ≈10$^3$ MC steps.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

REFERENCES

[1] C. M. Bishop, (1995). Neural Networks for Pattern Recognition, Oxford University Press, Oxford.
[2] B. Muller, J. Reinhardt, & M. T. Strickland, (2nd edition, 2002). Neural Networks: An Introduction (Physics of Neural Networks). Springer.
[3] J. M. Goodwin, B. E. Rosen, & J. J. Vidal, (1992). *International Journal of Pattern Recognition and Artificial Intelligence,* Vol. 6, No. 1, pp 157-177.
[4] B. E. Rosen & J. M. Goodwin, (1993). *IEEE International Conference on Neural Networks*, IEEE Press, San Francisco, Calif. pp 908-913.
[5] R. E. Rosenweig, Ferrohydrodynamics, Cambridge University Press. 1985.
[6] A. Aharon, (2000). Introduction to the theory of ferromagnetism 2nd edn. Oxford University Press, Oxford.
[7] Z. Qi, W. Jianhua, & Z. Hesun, (1996). *IEEE Transactions on Magnetics*, Vol. 32, No. 2, pp 297-301.
[8] A. Satoh, R. W. Chantrell. S. Kamiyama & G. N. Coverdale, (1996). *Journal of Magnetism and Magnetic Materials*, Vol. 154. pp 183-192.
[9] V. I. Kalikmanov, (1992). *Physica A*, Vol. 183, pp 25-50.
[10] A. Satoh, R. W. Chantrell, S. Kamiyama, & G. N. Coverdale, (1995). *Journal of Colloid and Interface Science*, Vol. 178, pp. 620-627.
[11] M. P. Allen & D. J. Tildesley, (1989). Computer simulation of liquids. Oxford University Press, Oxford.
[12] V. Korenivski & R. B. van Dover, (1997). Magnetic film inductors for radio frequency applications. *J. Appl. Phys.*, Vol. 82, No. 10, pp 5247-5254.
[13] B. Dieny, V. S. Speriosu, S. S. P. Parkin, B. A. Gurney, D. R. Wilhoit, and D. Mauri, (1991). Phys. Rev. B, Vol. 43, pp. 1297-1300.
[14] Shuai Ban and V. Korenivski, (2005). Unpublished.

The invention claimed is:

1. An associative memory device comprising a magnetically responsive layer adapted to store a representation of a pattern, the magnetically responsive layer comprising magnetic nanoparticles as a magnetically active component, the associative memory device characterized by that the magnetic nanoparticles are dispersed in a solvent with variable viscosity, and wherein the magnetically responsive layer is a layer of ferrofluid.

2. The associative memory device according to claim 1, wherein the viscosity of the solvent is such that a frozen state with immobilized magnetic nanoparticles is achievable in a temperature region of 0-100° C.

3. The associative memory device according to claim 1, further comprising a plurality of inductive elements or pads, arranged to provide local magnetic fields affecting the magnetically responsive layer.

4. A method of using a ferrofluid as an associative memory device, the method comprising steps associated with a training sequence, of:
    (a) imposing simultaneously an input and an output pattern, by exposing the ferrofluid layer with localised magnetic fields, wherein a first set of fields corresponds to the input pattern, and a second set of fields corresponds to the output pattern;
    (b) letting magnetic nanoparticles of the ferrofluid equilibrate with respect to particle positions and spin directions;
    (c) fixing particle positions;
    and steps associated with a recalling sequence, of:
    (d) imposing the input pattern to the ferrofluid layer;
    (e) letting the spin orientations equilibrate;
    (f) sensing a magnetic field from the ferrofluid layer.

5. The associative memory device according to claim 1, wherein the viscosity of the solvent is such that a frozen state with immobilized magnetic nanoparticles is achievable in a temperature region of between 15-70° C.

* * * * *